United States Patent
Mashimo

(10) Patent No.: US 6,522,211 B1
(45) Date of Patent: Feb. 18, 2003

(54) FREQUENCY-SWITCHING OSCILLATOR AND COMMUNICATION APPARATUS USING SAME

(75) Inventor: Yoshiyuki Mashimo, Komatsu (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 09/516,509

(22) Filed: Mar. 1, 2000

(30) Foreign Application Priority Data

Mar. 1, 1999 (JP) .......................................... 11-052877

(51) Int. Cl.$^7$ ................................................. H03B 5/00
(52) U.S. Cl. ..................... 331/117 R; 331/74; 331/179; 331/36 L
(58) Field of Search ......................... 331/117 R, 177 R, 331/36 C, 74, 177 V, 179, 36 L, 107 SL, 167

(56) References Cited

U.S. PATENT DOCUMENTS 6,072,373 A * 6/2000 Hayafuji et al. ......... 331/108 R
6,411,168 B2 * 6/2002 Yoshida .................. 331/117 D

FOREIGN PATENT DOCUMENTS

| JP | 9-186533 | 7/1997 |
| JP | 10-117109 | 5/1998 |
| JP | 10-145262 | 5/1998 |
| JP | 10-276039 | 10/1998 |

* cited by examiner

*Primary Examiner*—Arnold Kinkead
(74) *Attorney, Agent, or Firm*—Burns, Doane, Swecker & Mathis, LLP

(57) ABSTRACT

A frequency-switching oscillator has an oscillating circuit and a buffer circuit, wherein a matching circuit has a diode. The anode of the diode can be switched to be of a first potential and a second potential which is higher than the first potential. The cathode of the diode is set to a value of a third potential which is higher than the first potential by a certain level and is lower than the second potential by more than a switch voltage of the diode. Corresponding to switching of oscillation frequencies by a oscillating circuit, the frequency-switching oscillator allows frequencies matched in the buffer circuit to be switched and outputs frequencies of substantially the same levels for any of the oscillation frequencies.

16 Claims, 6 Drawing Sheets

FREQUENCY-SWITCHING OSCILLATOR AND COMMUNICATION APPARATUS USING SAME

BACKGROUND OF THE INVENTION

1. Field of the Invention

The present invention relates to a frequency-switching oscillator; in particular, the invention relates to a frequency-switching oscillator capable of outputting signals of a plurality of frequencies, and a communication apparatus using the frequency-switching oscillator.

2. Related Art

Recently, in markets for radio communication, particularly, for portable telephones, multiple communication services are provided in operating frequencies different from each other. Under these circumstances, in order to enjoy multiple communication services by one communication apparatus, signal sources (oscillators) of plural different frequencies from each other are demanded in one communication apparatus. Apparatuses that can be considered to be suitable for this purpose include a frequency-switching oscillator capable of switching and outputting signals of multiple frequencies.

FIG. 6 shows a conventional frequency-switching oscillator. A frequency-switching oscillator 1 is configured of an oscillating circuit 2 and a buffer circuit 3. In the oscillating circuit 2, a resonant circuit 4 capable of switching to two resonant frequencies is connected to the base of the transistor Q1 provided as a first oscillating active element. The collector of the transistor Q1 is grounded in a radio-frequency (RF) band to be used via a capacitor C1 (in a high frequency manner), and the emitter thereof is connected to the ground via a resistor R1 and a capacitor C2 to which the emitter is connected in parallel. The base and the emitter of the transistor Q1 are connected to each other via a capacitor C3. The emitter of the transistor Q1 is connected to the buffer circuit 3 via a capacitor C4.

The expression that an element is grounded in an RF band to be used via a capacitor (in a high frequency manner) substantially means that the element is connected to the ground via, for example, a capacitor with relatively large capacitance which allows the impedance to become sufficiently small at an oscillation frequency, whereby, despite that the element is not directly grounded, the element is made to be in the same condition as in the case where the element is substantially grounded at the oscillation frequency, i.e., a radio-frequency (high frequency band). Although the capacitance is not very large, a capacitor which causes series self-resonance by its own capacitance and a parasitic inductance component so as to be of a low impedance may be used.

In the buffer circuit 3, the transistor Q2 provided as a second amplifying active element and the transistor Q1 of the oscillating circuit 2 are cascade-connected by connecting their respective emitters and collectors. Also, the base of the transistor Q2 is connected to the oscillating circuit 2 via the capacitor C4, the emitter thereof is grounded via the capacitor C1 in an RF band to be used, and the collector is connected to an outputting terminal 5 via a capacitor C5. In addition, the collector of the transistor Q2 is connected to the ground via a capacitor C6, and is connected to a power-supplying terminal 6 via an inductor L1 comprising of lumped constant line; and the capacitor C6 and an inductor L1 constitutes a matching circuit 7. In addition, the power-supplying terminal 6 is grounded in an RF band to be used via a capacitor C7.

Resistors R2, R3, and R4 are connected in series between the power-supplying terminal 6 and the ground. A node between the resistors R2 and R3 is connected to the base of the transistor Q2. A node between the resistors R3 and R4 is connected to the base of the transistor Q1, whereby bias voltage is supplied to the bases of the transistor Q1 and the transistor Q2. Among these elements, the capacitors C1 and C4 and the resistors R2, R3, and R4 are shared by the oscillating circuit 2 and the buffer circuit 3.

In the frequency-switching oscillator 1 configured as above, the resonant frequency in the resonant circuit 4 is switched between two frequencies. According to this, an oscillation frequency in the oscillating circuit 2 is switched between two frequencies, and the two frequencies are amplified by the buffer circuit 3 so as to be outputted.

In the above configuration, however, characteristics of the matching circuit 7 in the buffer circuit 3 are fixed. Therefore, for the frequency-switching oscillator 1, the matching circuit 7 must be designed so as to match the two oscillation frequencies. However, when the difference between the two frequencies is large, it is difficult for the matching circuit 7, because characteristics are fixed, to handle both frequencies. In this case, problems are that the matching circuit 7 can match only one of the frequencies, and the level of a signal of the other oscillation frequency decreases, thereby disabling signals of substantially the same levels at all the oscillation frequencies to be outputted.

SUMMARY OF THE INVENTION

To solve the above problem, an object of the present invention is to provide a frequency-switching oscillator and a communication apparatus using the frequency-switching oscillator. Corresponding to frequency-switching in an oscillating circuit, a frequency-switching oscillator to be provided can switch matching frequencies in a buffer circuit so as to produce outputs of substantially the same levels at any of the frequencies.

To these ends, according to one aspect of the present invention, there is provided a frequency-switching oscillator having an oscillating circuit that has a first active element and that can switch and output a plurality of oscillation frequencies which are different from each other; and a buffer circuit, the buffer circuit is connected to an output of the oscillating circuit and comprises a second active element and a matching circuit. In the above, the matching circuit has a diode, the anode of the diode is switched between a first potential and a second potential which is higher than the first potential, and the cathode of the diode is set to a value of a third potential which is higher than the first potential by a predetermined level and is lower than the second potential by a switch voltage level or greater of the diode.

According to the above configuration, corresponding to oscillation-frequency switching by the oscillating circuit, frequencies to match the buffer circuit are switched, and outputs of substantially the same levels for any of the oscillation frequencies can be obtained.

In the above case, the first active element and the second active element may be cascade-connected, a connection point of the first and second active elements may be grounded via a capacitor in an RF band to be used (in a high frequency band to be used), and the cathode of the diode may be connected to the connection point of the first and second active elements. This allows reduction in the number of component parts, thereby allowing miniaturization and cost reduction.

Also, in the frequency switching oscillator of the present invention, one of the terminals of the second active element may be grounded in an RF band to be used via a capacitor, and the cathode of the diode is connected to a connection point of the second active element and the capacitor. This also allows reduction in the number of component parts, thereby allowing miniaturization and cost reduction.

Furthermore, according to another aspect of the present invention, there is provided a communication apparatus using the frequency-switching oscillator described above. Because of using the frequency-switching oscillator described above, the communication apparatus allows multiple frequencies to be transmitted and received stably.

DESCRIPTION OF THE PREFERRED EMBODIMENTS

Figure 1:
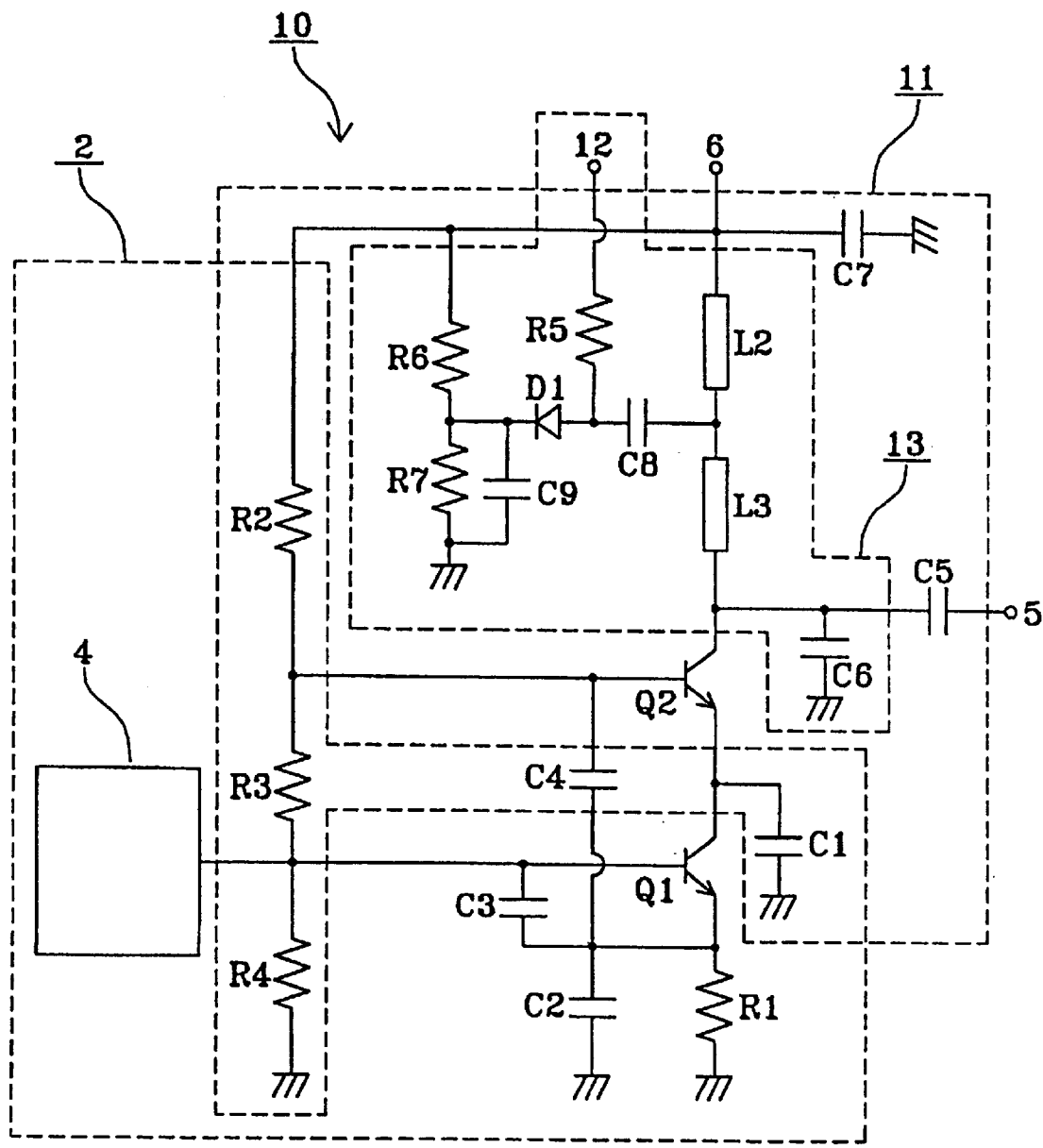
FIG. 1 is a circuit diagram showing an embodiment of a frequency-switching oscillator according to the present invention.
Figure 6:
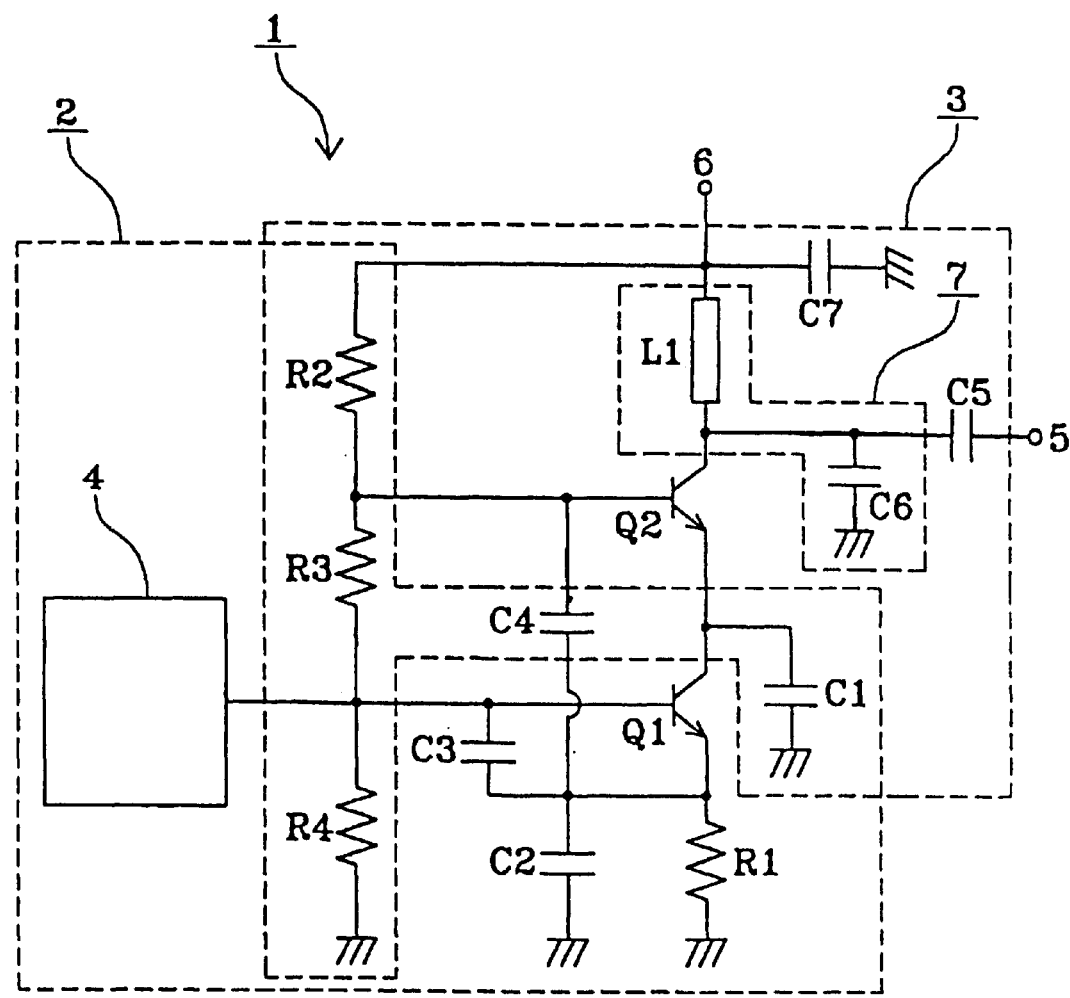
FIG. 6 is a circuit diagram showing a conventional frequency-switching oscillator.

FIG. 1 shows an embodiment of a frequency-switching oscillator according to the present invention. In this figure, elements which are the same as or equivalent to those in FIG. 6 are given the same reference symbols, and description thereof is omitted.

In a frequency-switching oscillator 10 shown in FIG. 1, two inductors L2 and L3 comprising a lumped constant transmission line are connected in series between a power-supplying terminal 6 of a buffer circuit 11 and a transistor Q2 provided as a second active element. A node point between the inductors L2 and L3 is connected to the anode of a diode D1 via a capacitor C8, and the cathode of the diode D1 is grounded in an RF band to be used (in a high frequency manner) via a capacitor C9. Also, the anode of the diode D1 is connected to a matching-switching terminal 12 via a resistor R5; and the cathode of the diode D1 is connected to a node point between a resistor R6 and a resistor R7. The resistors R6 and R7 are connected in series between the power-supplying terminal 6 and the ground. Among these elements, a matching circuit 13 comprises the capacitors C6, C8, and C9, the diode D1, the resistors R5, R6, and R7, and the matching-switching terminal 12.

In this arrangement, according to a DC voltage applied to the matching-switching terminal 12, the electrical potential of the anode of the diode D1 can be switched to a first electrical potential and a second electrical potential which is higher than the first electrical potential. On the other hand, the power-supply voltage applied in DC to the power-supplying terminal 6 is divided by the resistors R6 and R7. The electrical potential of the cathode of the diode D1 is set to a third electrical potential which is the divided voltage of the power-supply voltage.

The third electrical potential is set to a level higher than the first electrical potential by a predetermined level, and concurrently, is set to a value lower than the second electrical potential by a switch voltage or greater of the diode D1. In other words, the third potential is set at a value by subtracting a value of a switch voltage or a greater value from the second potential. The switch voltage is the lowest voltage required to allow the diode D1 to be electrically conductive in the forward direction, normally being 0.7 V. Specifically, with the first electrical potential of 0 V and the second electrical potential of 3V, in consideration of 0.7 V as the switch voltage of the diode D1, the third electrical potential is set to a level higher than 0 V (the first electrical potential) by a predetermined level, and the third electrical potential is set to 1 V which is lower than 3 V (the second electrical potential) by 0.7 V or greater (the switch voltage of the diode).

In the frequency-switching oscillator 10 configured as described above, when the anode of the diode D1 is set to the first electrical potential by grounding the matching-switching terminal 12, the potential difference between the anode and cathode of the diode D1 is negative (in a reverse bias condition). Therefore, since no DC is allowed to flow to the diode D1, the diode D1 becomes equivalent to a capacitor having small capacitance in the RF band to be used (in a high frequency manner).

Figure 2A:
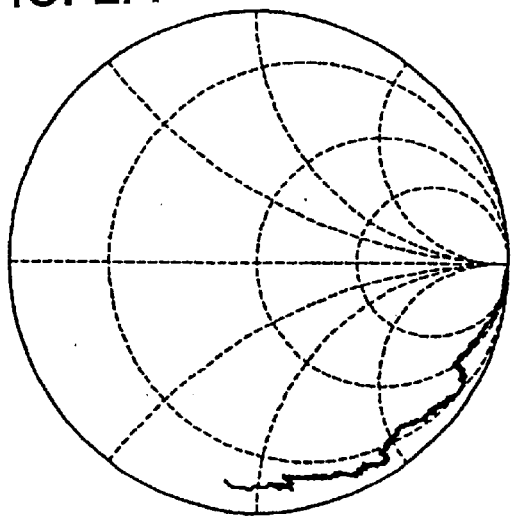
FIG. 2A shows reflection characteristics of a diode.
Figure 2B:
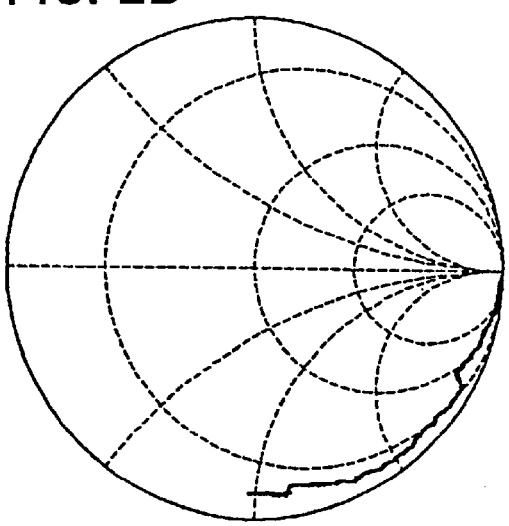
FIG. 2B shows reflection characteristics of the diode.
Figure 2C:
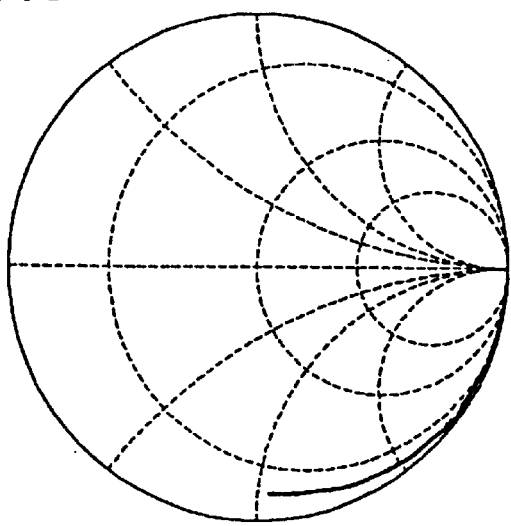
FIG. 2C shows reflection characteristics of the diode.
Figure 2D:
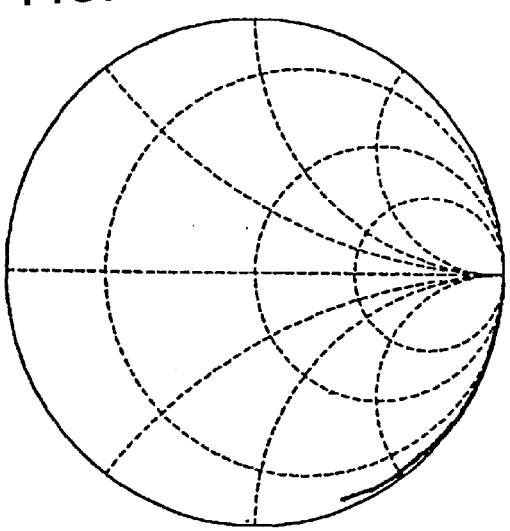
FIG. 2D shows reflection characteristics of the diode.

Each of FIGS. 2A to 2D shows reflection frequency characteristics of the diode D1 in Smith charts. The frequency sweep range is from 1 MHz to 1.8 GHz. In this case, the direction in which characteristic curves extend from the central right side to the central lower side is the direction in which the frequency increases. FIG. 2A shows a condition in which no potential difference exists between the anode and the cathode of the diode. FIG. 2B shows a condition in which a reverse bias of 0.1 V is being applied. FIG. 2C shows a condition in which a reverse bias of 0.2 V is being applied. FIG. 2D shows a condition in which a reverse bias of 1 V is being applied.

As can be seen from FIGS. 2A to 2D, when no bias is being applied to the diode D1 (in FIG. 2A) or when a reverse bias is being applied, but the value is small (in FIG. 2B), sharp changes, small variations, or the like occur in characteristics, and result in unstable reflection frequency characteristics. This is caused by an unstable value of capacitance between the anode and the cathode of the diode. Using the diode with the unstable capacitance value in the matching circuit may cause abnormal oscillations or spurious conditions in the frequency-switching oscillator. However, when a reverse bias higher than a certain level is being applied to the diode (in FIGS. 2C and 2D), no sharp variations nor small variations in characteristics occur, thus producing stable reflection characteristics, that is, the capacitance value. In this way, when the potential difference between the anode and the cathode of the diode becomes a negative value larger than a certain level, the capacitance value is more stable than in the case where the potential difference is 0 V. Also, the stable capacitance value of the diode prevents occurrence of the abnormal oscillation or the spurious condition in the frequency-switching oscillator.

Reference is made again to FIG. 1. As described above, because the diode D1 becomes equivalent to the capacitor having a stable small capacitance, the node point to which the inductors L2 and L3 are connected is connected in series to the ground via the capacitor C8, the diode D1 provided as a small capacitance, and the capacitor C9. Also, since the capacitance of the diode D1 is small, impedance significantly increases at a section from the capacitor C8 connected to the ground via the diode D1 and the capacitor C9. This condition may be regarded as if substantially nothing is connected to the node point between the inductors L2 and L3 in an RF band to be used. As viewed from the collector of the transistor Q2, this means a condition where the inductors L2 and L3 are connected in series between the collector and the power-supplying terminal 6. In the matching circuit 13 in the above described condition, since values of the inductors L2 and L3 are set so as to match one of two oscillation frequencies, a signal at a specified level in the oscillation frequency can be outputted.

On the other hand, when the potential of the anode of the diode D1 is set to the second electrical potential, since the potential difference between the anode and the cathode of the diode D1 increases to a level of 0.7 V or greater in the forward direction, DC is allowed to flow into the diode D1. For this reason, the diode D1 is short-circuited in an RF band to be used, the point to which the inductors L2 and L3 are connected in series to the ground via the capacitors C8 and C9. Also, since the cathode of the diode D1 is grounded in an RF band to be used via the capacitor C9, the node to which the inductors L2 and L3 are connected is substantially connected to the ground via the capacitor C8. For the collector of the transistor Q2, this means a condition where the capacitor C8 is added between the node to which the inductors L2 and L3 are connected and the ground. This causes a difference from the case when the anode of the diode D1 is set to the first electrical potential. Therefore, in the matching circuit 13 in the above described condition, since values of the inductors L2, L3 and the capacitor C8 are set so as to match the other of two oscillation frequencies, at the other frequency a signal having substantially the same level as one oscillation frequency described above is outputted.

In this way, in the frequency-switching oscillator 10, the matching circuit 13 in the buffer circuit 11 is arranged so as to perform switching and matching corresponding to two oscillation frequencies by using the diode D1. Outputs substantially at equalized levels are obtained without causing abnormal oscillations and spurious conditions at any one of the oscillation frequencies.

Figure 3:
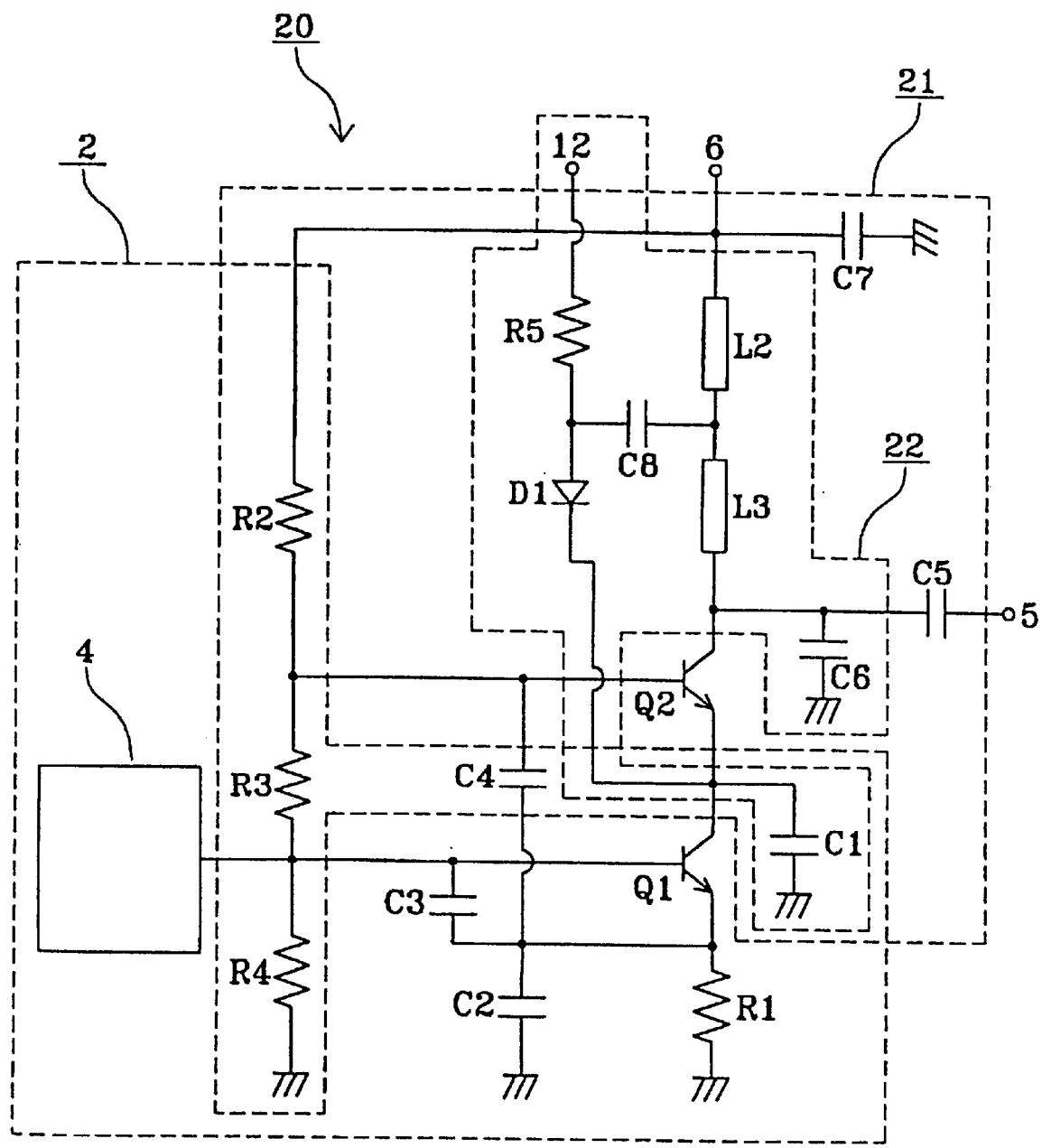
FIG. 3 is a circuit diagram showing another embodiment of the frequency-switching oscillator according to the present invention.

FIG. 3 shows another embodiment of the frequency-switching oscillator according to the present invention. In this figure also, elements which are the same as or equivalent to those in FIG. 1 are given the same reference symbols, and description thereof is omitted.

In a frequency-switching oscillator 20 shown in FIG. 3, the cathode of a diode D1 provided in a matching circuit 22 of a buffer circuit 21 is connected to a node between the emitter of a transistor Q2 provided as a first active element and the collector of a transistor Q1 provided as a second active element. Also, as already described, the node is grounded in an RF band to be used via a capacitor C1. Therefore, the capacitor C1 is included in the matching circuit 22.

In the frequency-switching oscillator 20 thus configured, since the transistor Q1 and the transistor Q2 are cascade-connected, the connection point has an electrical potential between voltage applied in DC to a power-supplying terminal 6 and the ground. Also, since the connection point is grounded in an RF band to be used via the capacitor C1, the potential is relatively stable. For these reasons, the electrical potential at the point is used as a third electrical potential, and a second electrical potential to be applied to the anode of the diode D1 is set to be higher than the third potential by a switch voltage of the diode D1. Thus, the electrical potential to be applied to the anode and the cathode of the diode D1 achieves the same condition as in the case of the frequency-switching oscillator 10, as shown in FIG. 1. As a result, in the frequency-switching oscillator 20, the matching circuit 22 in the buffer circuit 21 is arranged so as to perform switching and matching corresponding to two oscillation frequencies. Thereby, outputs of substantially equalized levels are obtained without causing abnormal oscillations and spurious conditions for any one of the oscillation frequencies.

In addition, the frequency-switching oscillator 20 does not require the resistors R6 and R7 for generating the third electrical potential, nor is the capacitor C9 for grounding the cathode of the diode D1 in an RF band required, which are used in the frequency-switching oscillator 10 shown in FIG. 1. Therefore, miniaturization by reduction in the number of components and reduction in cost can be implemented.

Figure 4:
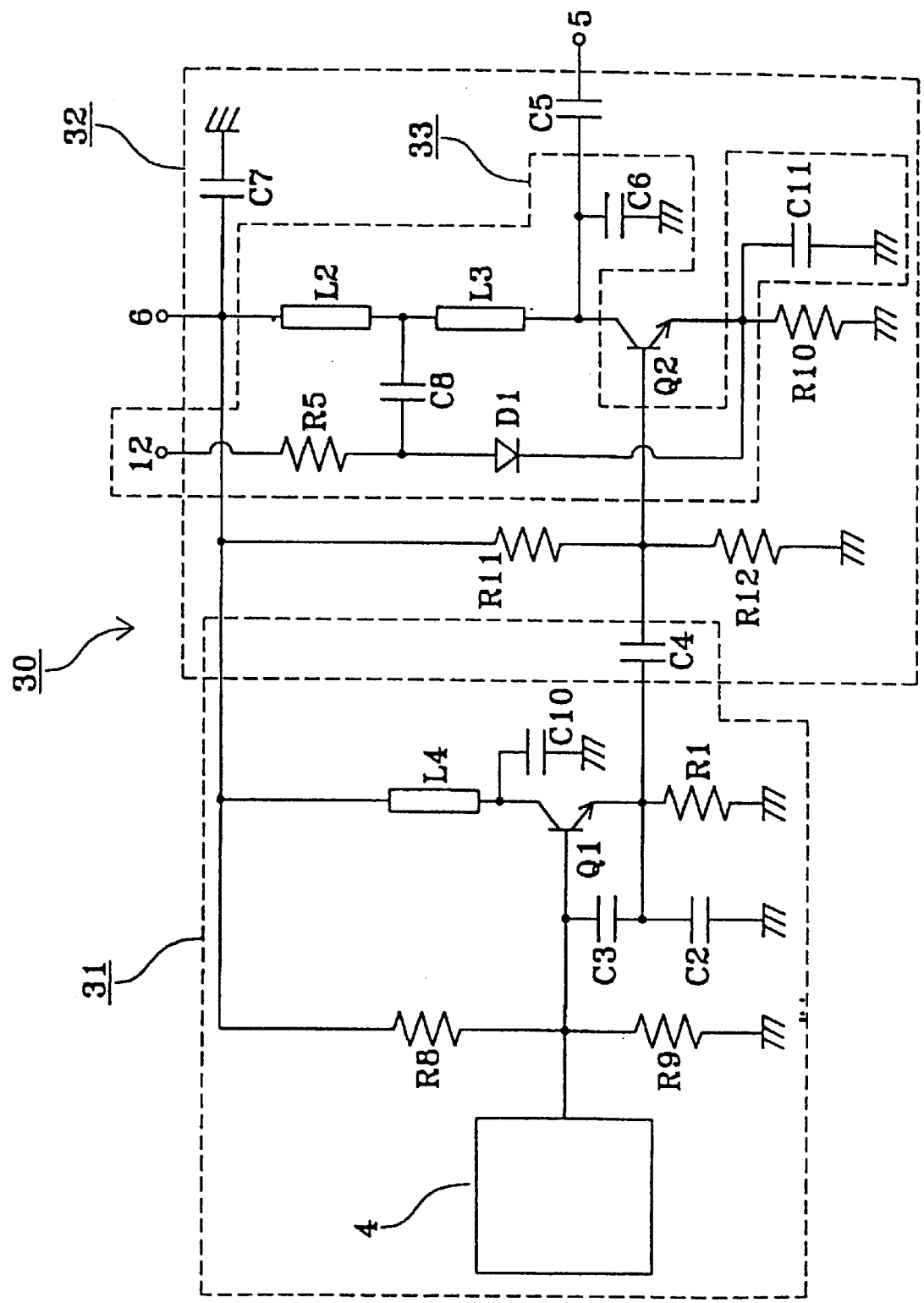
FIG. 4 is a circuit diagram showing yet another embodiment of the frequency-switching oscillator according to the present invention.

FIG. 4 shows yet another embodiment of the frequency-switching oscillator according to the present invention. In this figure also, portions which are the same as or equivalent to those in FIG. 3 are given the same reference symbols, and description thereof is omitted.

In a frequency-switching oscillator 30 in FIG. 4, a transistor Q1 provided as a first active element of an oscillating circuit 31 and a transistor Q2 provided as a second element of a buffer circuit 32 are not cascade-connected, and are connected in parallel between a power-supplying terminal 6 and the ground. Also, in the oscillating circuit 31, the collector of the transistor Q1 is grounded in an RF band to be used via a capacitor C10, and is connected to the power-supplying terminal 6 via an inductor L4 comprising a lumped constant transmission line. The base of the transistor Q1 is connected to a node between resistors R8 and R9, which are connected in series between the power-supplying terminal 6 and the ground, and a bias voltage is supplied to the base.

In the buffer circuit 32, the emitter of the transistor Q2 provided as the second active element is grounded in an RF band to be used via a capacitor 11, and is also connected to the ground via the resistor RIO. The cathode of a diode D1 provided in a matching circuit 33 is connected to a connection point to which the emitter of the transistor Q2 and the capacitor C11 are connected. The capacitor 11 is included in the matching circuit 33. The base of the transistor Q2 is connected to a connection point between resistors R11 and R12, which are connected in series between the power-supplying terminal 6 and the ground. A bias voltage is supplied to the base.

The oscillating circuit 31 and the buffer circuit 32 are connected via a capacitor C4. In this case, the capacitor C4 is shared by the oscillating circuit 31 and the buffer circuit 32.

In the frequency-switching oscillator 30 configured as described above, the connection point between the emitter of the transistor Q2 and the capacitor C11 has an electrical potential higher than the electrical potential of the ground by a voltage drop which is caused due to a resistor R10. In addition, since the connection point is grounded in an RF band to be used via the capacitor C11, the potential is relatively stable. For these reasons, the electrical potential at the connection point is used as a third electrical potential, and a second electrical potential to be applied to the anode of the diode D1 is set to be higher by a switch voltage of the diode D1. Thus the electrical potential to be applied to the anode and the cathode of the diode D1 becomes the same condition as in the case of the frequency-switching oscillator 10 in FIG. 1.

In this way, in the frequency-switching oscillator 30, the matching circuit 33 in the buffer circuit 32 is arranged so as to perform switching and matching corresponding to two oscillation frequencies, thereby outputs substantially at equalized levels are obtained without causing abnormal oscillations and spurious conditions for any one of the oscillation frequencies. Furthermore, similarly in the case of the frequency-switching oscillator 20, this configuration allows miniaturization by reduction in the number of components and reduction in cost.

The individual embodiments described above have a configuration in which the buffer circuit performs matching corresponding to the oscillating circuit that outputs two oscillation frequencies. However, in the present invention, the number of the frequencies is not limited to two, and the invention may include an arrangement which uses two or more diodes such that the buffer circuit may perform matching corresponding to three or more oscillation frequencies.

Figure 5:
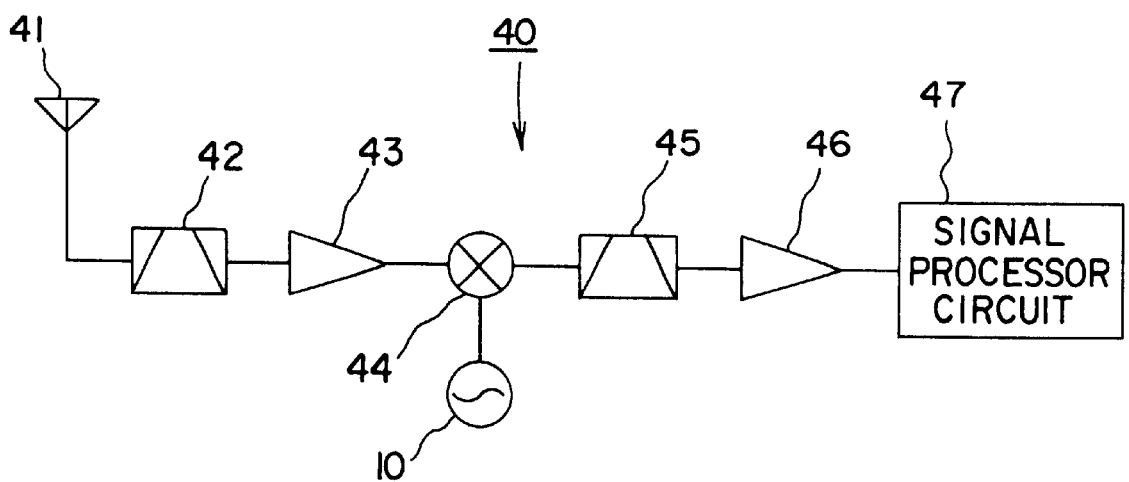
FIG. 5 is a schematic view of an embodiment of a communication apparatus according to the present invention.

As an embodiment of a communication apparatus of the present invention, FIG. 5 shows a block diagram of a receiver circuit section of a communication apparatus 40 using the frequency-switching oscillator 10 of the present invention, as shown in FIG. 1. In FIG. 5, the communication apparatus 40 comprises an antenna 41, a wide-band-pass filter 42, a wide-band amplifier 43, the frequency-switching oscillator 10, a mixer 44, a narrow-band-pass filter 45, an amplifier 46, and a signal processor circuit 47. In this configuration, the antenna 41 is connected to the mixer 44 via the wide-band-pass filter 42 and the amplifier 43. The frequency-switching oscillator 10 is also connected to the mixer 44. The output of the mixer 44 is connected to the signal processor circuit 47 via the narrow-band-pass filter 45 and the amplifier 46.

In the communication apparatus 40 configured as described above, a signal received by the antenna 41 is filtered by the wide-band-pass filter 42 and unnecessary signal components are eliminated from the signal. Then, the signal is amplified by the amplifier 43, and is inputted to the mixer 44. The signal inputted to the mixer 44 includes two RF signals to be handled by the communication apparatus 40. On the other hand, a local signal generated in the frequency-switching oscillator 10 is also inputted to the mixer 44. The mixer 44 mixes the RF signals and the local signal outputted from the frequency-switching oscillator 10 and outputs an IF signal with respect to the difference in frequency therebetween. At this time, the oscillation frequency of the local signal outputted from the frequency-switching oscillator 10 is switched so as to correspond to the frequency of an intended RF signal, whereby the IF signal corresponding to the intended RF signal is outputted. In this case, because an output which is stable for any of the oscillation frequencies can be obtained from the frequency-switching oscillator 10, an output of the IF signal from the mixer is also stable.

Unnecessary signal components of the IF signal outputted from the mixer 44 are eliminated by the narrow-band-pass filter 45. Then, the IF signal is amplified by the amplifier 46 and is inputted to the signal processor circuit 47. The signal processor circuit 47 demodulates the inputted signal, takes out information contained in the signal, and outputs the information as, for example, a sound.

As described above, by using the frequency-switching oscillator 10, signals of a plurality of frequencies are received stably.

For the communication apparatus 40, only the receiver circuit section is described. However, also in a transmitter circuit section, using the frequency-switching oscillator 10 allows signals of a plurality of frequencies to be transmitted stably.

Also, the communication apparatus 40 is configured using the frequency-switching oscillator 10 shown in FIG. 1. However, a configuration using the frequency-switching oscillator 20 or 30 shown in FIG. 3 or 4 obtains the same advantages as in the configuration using the frequency-switching oscillator 10.

As above, the present invention has been described with reference to the preferred embodiments. However, the invention is not restricted to the embodiments, and it may be modified in various ways within the scope of the invention.

What is claimed is:

1. A frequency-switching oscillator comprising:
   an oscillating circuit comprising a first active element and being capable of switching and outputting a plurality of oscillation frequencies which are different from each other, and
   a buffer circuit connected to an output of the oscillating circuit and comprising a second active element and a matching circuit,
   wherein the matching circuit comprises a diode, the anode of the diode is switched to a first potential and a second potential which is higher than the first potential, and the cathode of the diode is grounded via a capacitor and is set to a value of a third potential which is higher than the first potential by a predetermined level and is lower than the second potential by a switch voltage or greater of the diode.

2. A frequency-switching oscillator as set forth in claim 1, wherein the first active element and the second active element are cascade-connected, a connection point of the first and second active elements is grounded via the capacitor in a high frequency band to be used, and the cathode of the diode is connected to the connection point of the first and second active elements.

3. A frequency-switching oscillator as set forth in claim 1, wherein one of the terminals of the second active element is grounded in a high frequency band to be used via the capacitor, and the cathode of the diode is connected to a connection point of the second active element and the capacitor.

4. A communication apparatus using the frequency-switching oscillator as set forth in claim 1.

5. A communication apparatus using the frequency-switching oscillator as set forth in claim 2.

6. A communication apparatus using the frequency-switching oscillator as set forth in claim 3.

7. A frequency switching oscillator with an oscillator circuit and a buffer circuit, said frequency switching oscillator comprising:
   a matching circuit;
   an oscillator circuit active element;
   a lumped constant transmission line connected to said oscillator circuit active element;
   a diode connected to said lumped constant transmission line and also connected to a matching switching terminal;
   wherein said matching circuit is set to a first impedance by applying a first voltage to said matching switching terminal, and said matching circuit is set to a second impedance by applying a second voltage to said matching switching terminal, wherein said matching circuit is set to a third impedance by applying a third voltage to said matching switching terminal.

8. The frequency switching oscillator according to claim 7, wherein said buffer circuit comprises the matching circuit and the lumped constant transmission line.

9. The frequency switching oscillator according to claim 7, wherein said lumped constant transmission line comprises two impedance elements in series.

10. The frequency switching oscillator according to claim 9, wherein said diode is connected to a node between the two impedance elements.

11. The frequency switching oscillator according to claim 9, wherein said diode is connected via a capacitor to the node between the two impedance elements.

12. The frequency switching oscillator according to claim 11, wherein one end of said capacitor is directly connected to the node between the two impedance elements, and wherein an other end of said capacitor is directly connected to said diode.

13. The frequency switching oscillator according to claim 7, wherein the two impedance elements are inductive elements.

14. The frequency switching oscillator according to claim 7, wherein said lumped constant transmission line is connected to said oscillator circuit active element via a buffer circuit active element.

15. The frequency switching oscillator according to claim 7, wherein said first impedance is a first oscillation frequency matching impedance and said second impedance is a second oscillation frequency matching impedance.

16. The frequency switching oscillator according to claim 15, wherein said third impedance being a third oscillation frequency matching impedance.

* * * * *